United States Patent [19]

Mizushima et al.

[11] 4,350,541
[45] Sep. 21, 1982

[54] DOPING FROM A PHOTORESIST LAYER

[75] Inventors: Yoshihiko Mizushima, Fuchu; Akitsu Takeda, Tokyo; Akira Yoshikawa, Higashiyamato; Osamu Ochi, Sayama; Tomoko Hisaki, Hamuramachi, all of Japan

[73] Assignee: Nippon Telegraph & Telephone Public Corp., Tokyo, Japan

[21] Appl. No.: 174,275

[22] Filed: Jul. 31, 1980

[30] Foreign Application Priority Data

Aug. 13, 1979 [JP] Japan ............................... 54-103051
Aug. 13, 1979 [JP] Japan ............................... 54-103052

[51] Int. Cl.³ .......................................... H01L 21/225
[52] U.S. Cl. ................................... 148/188; 148/186; 148/187; 148/190
[58] Field of Search ............... 148/188, 187, 186, 190; 430/319

[56] References Cited

U.S. PATENT DOCUMENTS

| 3,532,563 | 10/1970 | Genser | 148/188 |
| 3,801,384 | 2/1974 | Schmidt | 148/188 |
| 4,127,414 | 11/1978 | Yoshikawa et al. | 96/67 |
| 4,206,026 | 6/1980 | Briska et al. | 148/188 X |

Primary Examiner—G. Ozaki
Attorney, Agent, or Firm—Kenyon & Kenyon

[57] ABSTRACT

A method for fabricating semiconductor devices comprising the steps of: forming on the main surface of a semiconductor substrate an inorganic photoresist layer having a first amorphous layer, which contains Se as a matrix component and includes an impurity for providing one conductivity type and a second silver, or a silver containing layer, formed on the first layer; exposing the inorganic photoresist layer with an exposure pattern; developing the exposed inorganic photoresist layer to form a patterned impurity containing inorganic photoresist layer as an impurity source layer; forming a heat resistive overcoating layer on the main surface of the semiconductor substrate, while covering the impurity source layer; and forming a doped region by diffusing impurity from the impurity source layer into a region of the substrate underlying the impurity source layer. The heat resistive overcoating layer may be an insulation layer having a window through which a conductive layer is connected to the doped region and is extended over the overcoating layer. The doped region is formed readily and accurately with relatively few process steps and with a pattern corresponding to an exposure pattern for the inorganic photoresist layer. The diffusion of the impurity from the impurity source layer into the substrate is accurately controlled so as to provide the doped region with a desired impurity concentration. Moreover, the evaporation of the impurity into the atmosphere during processing is minimized.

22 Claims, 12 Drawing Figures

DOPING FROM A PHOTORESIST LAYER

BACKGROUND OF THE INVENTION

The present invention relates to a method for fabricating a semiconductor device having a doped semiconductor region which is formed in a semiconductor substrate by diffusing dopant for providing a given conductivity type from the main surface of the substrate and, more particularly, to a method of fabricating semiconductor devices in which an impurity diffused region is formed with fewer process steps and with a high accuracy by using inorganic photoresist.

In order to form a p- or n-type region at a given location of a semiconductor substrate, a conventional technique in this field has employed mainly a selective solid diffusion of dopant with the usage of a diffusion mask. In this conventional technique, $SiO_2$ layer or the like is formed as a diffusion mask layer on the semiconductor substrate. A desired window is opened in the diffusion mask by conventional photolithography. A dopant is then selectively diffused in the semiconductor substrate through the window. The conventional technique therefore requires the formation and patterning of the diffusion mask. This results in the disadvantages that there are many process steps and many diffusion control parameters. In addition, in most cases, the diffusion mask $SiO_2$ layer is required to be relatively thick. As a result, it is difficult to determine with high accuracy the size of the window formed in the diffusion mask layer due to dimensional changes caused by pattern transformation. There is also another disadvantage in that the dimensional accuracy of the diffusion region is not sufficient.

On the other hand, Yoshikawa et al. have disclosed in their U.S. Pat. No. 4,127,414, an inorganic photoresist using a selenium chalcogenide glass thin film and an inorganic electron beam resist. The inorganic photoresist offers many advantages which include high resolution, compatibility with a dry development process, strong resistance against a highly acidic etching solution, and production of a uniform and homogenous thin amorphous film over a relatively wide area. The inventors of the present invention have focused on the inorganic photoresist and recognized that the impurity diffusion by the inorganic photoresist is effective for the microfabrication of a semiconductor device. The present invention was made under the recognition of the empirical results.

Accordingly, it is an object of the present invention to provide a novel method for fabricating a semiconductor device in which an impurity-diffused region is formed by a simple process having a relatively small number of process steps, and which provides high dimensional accuracy.

Another object of the present invention is to provide a method for fabricating a semiconductor device in which a dopant is diffused by directly using an inorganic photoresist as a diffusion source.

Yet another object of the present invention is to provide a method for fabricating a semiconductor device in which a conductive layer is connected to a doped region by a simple process having few steps.

A further object of the present invention is to provide a method of fabricating a semiconductor device in which a conductive layer is electrically connected to an impurity diffused region, following the step to form a doped region by diffusing dopant from an inorganic photoresist being used as a diffusion source.

SUMMARY OF THE INVENTION

According to one aspect of the present invention, there is provided a method of fabricating a semiconductor device comprising the steps of: forming on the main surface of a semiconductor substrate an inorganic photoresist layer having a first amorphous layer, which contains selenium as a matrix component and includes dopant for providing a given conductivity type, and forming a second layer on the first layer. The second layer is a silver layer, or a layer which contains silver. The method contains the further steps of exposing the inorganic photoresist layer with a given exposure pattern; developing the exposed inorganic photoresist layer to form an impurity containing inorganic photoresist layer having a pattern corresponding to the exposure pattern; forming a heat resistive overcoating layer on the main surface of the semiconductor substrate, the heat resistive overcoating layer being arranged to cover the impurity containing inorganic photoresist layer; and forming a doped semiconductor region by diffusing the dopant from the impurity containing inorganic photoresist layer into a region of the substrate underlying the impurity containing inorganic photoresist layer.

In one embodiment, first layer may be an amorphous chalcogenide thin layer having a binary system containing selenium and germanium as matrix components, preferably 75 to 95 atom of selenium and 5 to 25 atom % of germanium, and a dopant such as arsenic (As), phosphorus (P), boron (B), aluminum (Al), antimony (Sb), gallium (Ga), indium (In) or the like, in embodiment where the semiconductor substrate is a silicon substrate. Such a multi-component thin layer may readily be formed by radio frequency sputtering in the form with a target of an ingot having a given composition. Alternatively the thin layer may be formed by co-sputtering a binary system material and a dopant or dopants or by the vacuum evaporation method. The second layer may be formed on the first layer by either vacuum evaporation or sputtering of silver, an alloy or compound containing silver, or by immersing the specimen in a solution containing silver ions, for example, an aqueous solution of silver nitrate ($AgNO_3$). These methods allow the second layer to be deposited on the first layer selectably as a silver layer, a silver alloy layer, a silver chalcogenide layer or a silver halide layer.

The inorganic photoresist layer having the first and second layers is exposed to a selectable one of a light, an electron beam or an ion beam having a given exposure pattern. As a result of the exposure, the exposed portion becomes a silver-doped region which is almost insoluble in a developer, for example, an aqueous solution of an alkali, such as dimethylamine (($CH_3)_2NH$), potassium hydroxide (KOH), sodium hydroxide (NaOH) or the like. Then, the silver layer of silver containing layer at the non-exposed areas is dissolved off by etching with an acid solution such as diluted aqua regia, nitric acid or the like. Subsequently, the inorganic photoresist layer at the non-exposed areas is removed from the substrate by the developer. In the follower step, the main surface of the semiconductor substrate and the impurity containing inorganic photoresist layer are covered with a heat resistive overcoating layer made of an insulating material such as silicon oxide ($SiO_2$), silicon nitride ($Si_3N_4$) or silicon (Si), titanium (Ti), platinum (Pt) or the like by the sputtering process or by the electron beam evaporation process.

The subassembly comprising the semiconductor substrate and the impurity containing inorganic photoresist layer thereon is then covered with the heat resistive overcoating layer and is subjected to a heat treatment step so as to diffuse the dopant in the impurity containng inorganic photoresist layer thereby forming an impurity diffused region. During the heat treatment, the material constituting the impurity containing inorganic photoresist layer may partially or wholly melt into the heat resistive overcoating layer, depending on the material used in the heat resistive overcoating layer.

Next, the heat resistive overcoating layer and the remaining impurity containing inorganic photoresist layer are removed from the substrate. For example, when the heat resistive overcoating layer is $SiO_2$, the layer is etched off by buffered HF solution. The impurity containing inorganic photoresist layer is dissolved off by etching with a mixed solution of sulfuric acid ($H_2SO_4$) and hydrogen peroxide ($H_2O_2$). In this way, the heat resistive overcoating layer and the remaining impurity containing inorganic photoresist layer are removed, so that a semiconductor device having an impurity diffused region is obtained.

In another aspect of the present invention, there is provided a method of fabricating a semiconductor device comprising the steps of: forming on the main surface of a semiconductor substrate an inorganic photoresist layer having a first amorphous layer, which contains selenium as a matrix component and includes dopant for providing a given conductivity type, and forming a second layer on the first layer. The second layer is a silver layer or a layer which contains silver. The method contains the further steps of exposing the inorganic photoresist layer with a given exposure pattern; developing the exposing inorganic photoresist layer to form an impurity containing inorganic photoresist having a pattern corresponding to the exposure pattern; forming heat resistive overcoating insulation layer on the main surface of the semiconductor substrate, the heat resistive overcoating insulation layer being arranged to cover the impurity containing inorganic photoresist layer; forming a doped semiconductor region by diffusing the dopant from the impurity containing inorganic photoresist layer into a region of the substrate underlying the impurity containing inorganic photoresist layer; opening in the heat resistive overcoating insulation layer a window to allow to allow the semiconductor region to communicate with the exterior; and forming on the heat resistive overcoating insulation layer a conductive layer connected to the semiconductor layer through the window, the conductive layer, extending over the heat resistive overcoating insulation layer.

In this embodiment, $SiO_2$ or $Si_3N_4$, for example, may be employed as the heat resistive overcoating insulation layer. The above-mentioned steps and materials are correspondingly applicable to the fabrication process from the starting step to the step of forming the doped semiconductor region. After the doped semiconductor region is formed, the conventional photoetching technique is applied to the semiconductor substrate and the heat resistive overcoating insulation layer over the semiconductor substrate, thereby forming a window to allow the semiconductor region to be in communication with the exterior. In the next step, an electrode metal such as aluminum (Al) or molybdenum (Mo) is deposited over the entire surface of the heat resistive overcoating insulation layer. The metal layer thus deposited is then subjected to photoetching process thereby forming a conductive layer having a given pattern in the form of a wiring layer which is electrically connected to the semiconductor region through window. In embodiments which use such a heat resistive overcoating insulation layer, a desired portion other than the window portion is maintained unetched and is used for electrically insulating the semiconductor substrate from the conductive layer.

BRIEF DESCRIPTION OF THE DRAWINGS

A clearer understanding of the invention will be attained by reading the following description with reference to the accompanying drawings, in which.

DETAILED DESCRIPTION OF PREFERRED EMBODIMENTS

Figure 1:
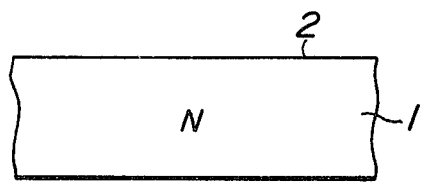
FIGS. 1 through 7 are schematic cross-sectional representations illustrating an embodiment of a sequence of steps of fabricating a semiconductor device according to the present invention.
Figure 2:
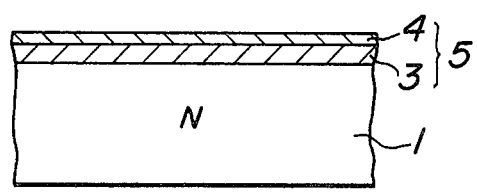

An embodiment of a method of fabricating a semiconductor device according to the invention will be described referring to the accompanying drawings. A semiconductor substrate 1 of n-type, for example, a silicon substrate, as shown in FIG. 1, is prepared. On the main surface 2 of the semiconductor substrate 1, as shown in FIG. 2, is formed an inorganic photoresist layer 5 having a first layer 3 which contains, as main components of matrix selenium and germanium or selenium, germanium and sulfur and further includes one or more dopants, for example, p-type dopant such as B, Al, Ga or In, and a second layer 4 as a silver laer or a silver-containing layer, which is formed on the first laer 3. In embodiments where light beam exposure technology is utilized, it is desirable that the matrix component of the first layer 3 be an amorphous chalcogenide layer having a chemical composition of 75 to 95 atm % of selenium and 5 to 25 atm % of germanium, in accordance with EXPERIMENT 1 disclosed in the above-mentioned U.S. Pat. No. 4,127,414. Further, the matrix components incorporate a required amount of doping impurities. In embodiments where electron beam technology is used, it is preferable that an amorphous chalcogenide matrix layer be formed as the main component of the first layer 3 containing 75 to 85 atom % of selenium and 15 to 25 atom % of germanium. This is in accordance with EXPERIMENT 2 disclosed in U.S. Pat. No. 4,127,414. The amorphous chalcogenide layer 3 may readily be formed by RF sputtering with an ingot having a given chemical composition as a target; by co-sputtering a binary system material containing selenium, germanium, and at least one dopant to be diffused; or by the vacuum evaporation process. The sputtering process is preferable over the vacuum evaporation process for reasons of reproducibility of the composition and the superior adhesion to the substrate. When the concentration of the dopant such as B, Al, Ga or In is 10 atom % or less, the film characteristics of the inorganic photoresist layer were substantially similar to those of the corresponding matrix component. As a result, the above-mentioned chemical compositions disclosed in U.S. Pat. No. 4,127,414 can be employed as the compositions of the matrix components of the first layer 3. Incidentally, the total amount of the dopant or dopants may be controlled by the composition of the target for the sputtering process, and the thickness of layer 3 may be, for example, between 0.05 and 0.5 $\mu$m. Accordingly, the impurity concentration may be well controlled.

For the formation of the inorganic photoresist layer 5, the second layer 4 then is formed on the first layer 3, in the form of a silver layer, a silver alloy layer, a silver chalcogenide layer ($Ag_2S$, $Ag_2Se$, AgSe, AgTe), a silver halide (AgCl, AgBr, AgI) or the like, by vacuum evaporation, sputtering process, or by immersion in a solution containing silver ions of the first layer 3, for example, an aqueous solution of silver nitrate ($AgNO_3$) or an electroless plating solution consisting mainly of silver cyanide (AgCN) or the like. The thickness of the second layer 4 is less than 100 Å, and generally between 20 and 50 Å.

Figure 3:
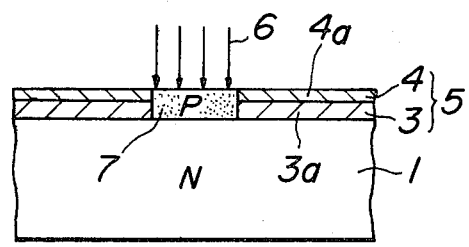

In the next step, as shown in FIG. 3, the inorganic photoresist layer 5 is exposed on the side of the second layer 4 to a light, an electron beam, an ion beam, or the like, as indicated by reference numeral 6. As a result, a silver-doped amorphous chalcogenide layer 7 corresponding to a desired pattern is formed as a region of the exposed or photodoped region of the layers 3 and 4. This region is hardly soluble in a developer consisting of an aqueous solution of an alkali, compared to unexposed or uphotodoped areas 3a of the layer 3. The developer may be, for example, dimethylamine (($CH_3)_2NH$), sodium hydroxide (NaOH), potassium hydroxide (KOH), or the like.

Figure 4:
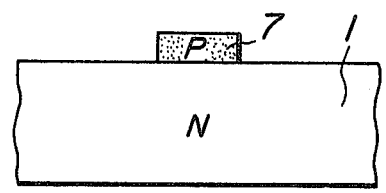

The silver or silver containing layer which remains over the unexposed region is dissolved off by an acid solution, for example, aqua regia or nitric acid. Then, those layers are subjected to a developing process using the alkaline solution whereby the unexposed areas 3a and 4a of the layers 3 and 4 are removed from the substrate 1, while the exposed region 7 shown in FIG. 4 is left. In this way, the exposed region 7, which contains a p-type dopant, is formed as an impurity containing inorganic photoresist layer with the help of the inorganic photoresist layer 5, and has a relief pattern corresponding to a predetermined pattern. The exposed region 7 is used as a diffusion source in a subsequent step. In addition, the plasma etching process may be used with $CF_4$ gas, instead of the above-mentioned developing treatment.

Figure 5:
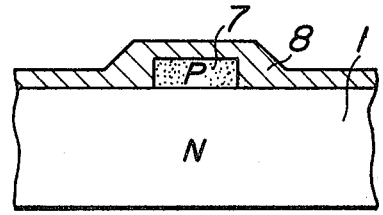

FIG. 5 shows a heat resistive overcoating layer 8 made of an insulating material such as silicon oxide ($SiO_2$), silicon nitride ($Si_3N_4$) or Si, Ti, Pt or the like, which is deposited by the sputtering process or the electron beam evaporation process, so as to cover the impurity containing inorganic photoresist layer or region 7, thereby preventing the layer 7 from melting or evaporation. This heat resistive overcoating layer 8 is used for preventing the sublimation of the impurity containing inorganic photoresist layer 7 in the next heat treatment step. The semiconductor substrate 1 and the dopant containing inorganic photoresist layer 7 on the main surface 2 of the substrate 1 is then subjected to a thermal treatment at temperatures substantially between 800° and 1100° C., while the substrate 1 and the layer 7 are covered by the heat resistive overcoating layer 8.

Figure 6:
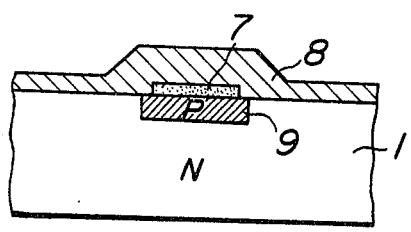

FIG. 6 shows a p-type semiconductor region 9 which is formed when p-type dopant is thermally diffused from the impurity containing inorganic photoresist layer 7. The depth of this p-type region 9, i.e., the diffusion depth, and the surface impurity concentration, may easily be controlled by advantageously selecting the heat treatment time to be between 10 minutes and several hours, and by selecting the diffusion temperature. During diffusion of the region 9, which may be performed in oxygen or nitrogen atmosphere, the diffusion proceeds independently of the ambient temperature since the impurity containing inorganic photoresist layer 7 is covered with the heat resistive overcoating layer 8.

Further, in the course of the heat treatment for forming the semiconductor region 9, it may happen that the material of the impurity containing inorganic photoresist layer 7 such as Se, Ge, or the like, completely or partially melts into the heat resistive overcoating layer 8, depending upon the material used for the overcoating layer 8, so that the impurity containing inorganic photoresist layer 7 may either completely disappear or diminish in volume, as shown in FIG. 6.

The following step removes the heat resistive overcoating layer 8 and the impurity containing inorganic photoresist layer 7 from the substrate 1. For example, when the heat resistive overcoating layer 8 is made of $SiO_2$, this layer 8 can be etched off by using buffered HF solution. The impurity containing inorganic photoresist layer 7 can be dissolved off by etching with a mixed solution of sulfuric acid ($H_2SO_4$) and hydrogen peroxide ($H_2O_2$). When the impurity containing inorganic photoresist layer 7 is completely melted into the heat resistive overcoating layer 8, the above-mentioned removing step of the impurity containing inorganic photoresist layer 7 is not required.

In this way, a semiconductor device is produced having the doped semiconductor region 9 in which a p-type dopant is diffused in an n-type semiconductor substrate 1 from the main surface 2 thereof.

The following discussion relates to an embodiment of this invention in which a conductive layer is connected to the semiconductor region 9 thus formed, while the conductive layer is insulated from the main surface 2 of the substrate 1. Also in this embodiment, the diffusion region 9 is formed by heat treatment while the substrate 1 and the impurity containing inorganic photoresist layer 7 are covered by the heat resistive overcoating layer 8. This embodiment is produced substantially by the process already explained with reference to FIG. 1 through FIG. 6, except that the heat resistive overcoating layer 8 used in the present embodiment is made of a material having both heat resistivity and electrical insulating properties, such as $SiO_2$, $Si_3N_4$, or the like.

Figure 9:
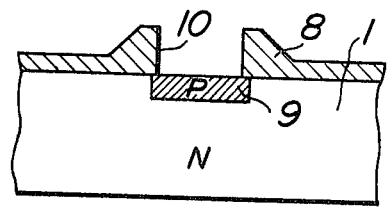
Figure 7:
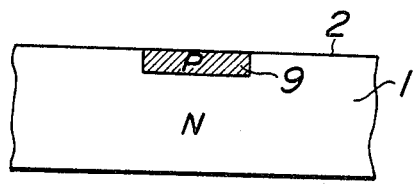
Figure 10:
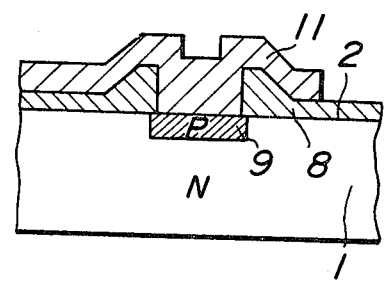
Figure 8:
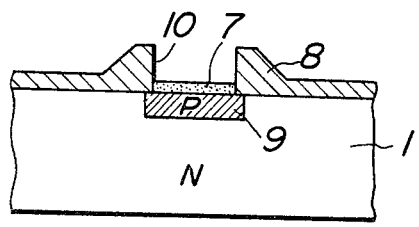
FIGS. 8 though 10 are schematic cross-sectional representations of an embodiment of a part of processes of fabricating a semiconductor device according to the invention.

As shown in FIG. 8, the conventional etching process is applied to the portion of the heat resistive overcoating insulation layer 8, which corresponds to the doped semiconductor region 9, to form a window or opening 10 for exposing the doped semiconductor region 9 to the exterior. If the impurity containing inorganic photoresist layer 7 is left unetched on the semiconductor region 9, as shown, it is removed from the portion on the region 9 by heat treatment or etching process or the like, as shown in FIG. 9, so as to expose the region 9 to the exterior through the window 10. If $SiO_2$ is used for the heat resistive overcoating insulation layer 8, the portion of the layer 8 over the impurity containing inorganic photoresist layer 7, after the diffusion process, is dissolved off at a slightly higher etching rate than the remaining portion. Accordingly, if $SiO_2$ or a similar material is used for the layer 8, the surface of the doped region 9 may be exposed while a portion of the layer 8, other than the portion on the doped region 9, is left unetched. Therefore, this is very convenient for forming the window 10.

Following this step, a metal layer, for forming an electrode of a material such as aluminum, is deposited over the entire surface of the heat resistive overcoating insulation layer 8 and then the metal layer thus formed is subjected to the photoetching process to produce a conductive layer 11 in the form of a wiring layer having a desired pattern and which is electrically connected to the doped semiconductor region 9 through the window 10. In this manner, the conductive layer 11 is formed on the main surface 2 of the semiconductor substrate 1. The conductive layer 11 is connected to the doped semiconductor region 9 and extends over the heat resistive overcoating insulation layer 8 which insulates the conductive layer 11.

It should be understood that although the invention has been described in terms of specific embodiments, person skilled in the art can make many changes and modifications, in light of this teaching, without departing from the spirit or exceeding the scope of the present invention. For example, the conductivity type n may be replaced by the other type p. The conductivity type of the doped semiconductor region may be the same as that of the semiconductor substrate.

The invention will be described in more detail with reference to the following examples of a B-doped $p^+n$ diode and an As-doped $n^+p$ diode, which are fabricated by using the method according to the invention.

EXAMPLE 1

Figure 11:
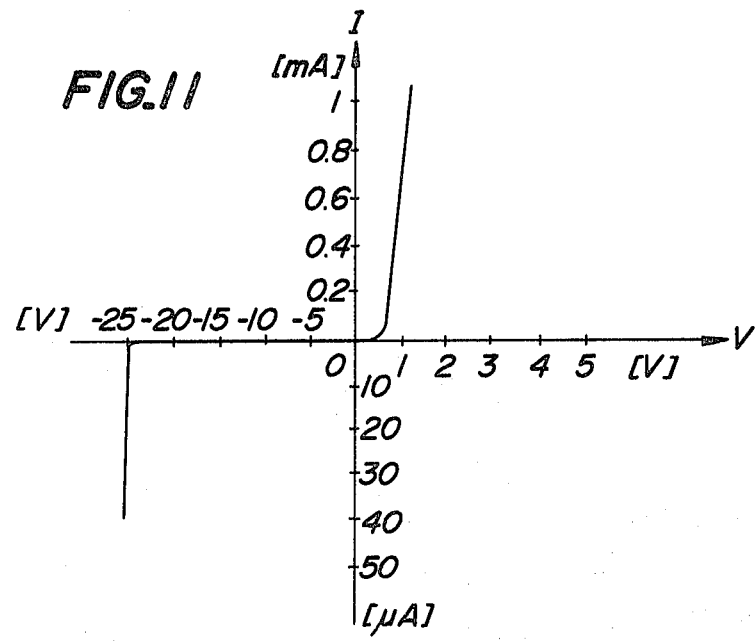
FIGS. 11 and 12 are characteristic graphs showing current-to-voltage characteristics of two types of diodes manufactured by the method according to the present invention.

The substrate used was an n-type silicon wafer having a resistivity of 0.5 $\Omega$.cm. Formed on the mirror-polished main surface was a first layer 3 having a thickness of 0.2 $\mu$m by a radio frequency sputtering process with a ternary system material of Se-Ge-B, where boron B was an impurity. In the chemical composition of the first layer 3, boron B was 5 atom % and the matrix components Se and Ge of the first layer 3 had a chemical composition of 75 atom % of Se and 25 atom % of Ge; i.e., the ratio of Se to Ge was Se:Ge=3:1. The Se-Ge-B thin film thus formed on the substrate was immersed in an electroless silver plating solution for four minutes, washed with water, and dried to form a silver layer having a thickness of approximately 50 Å as the second layer 4 on the first layer 3. In this way, the inorganic photoresist layer 5 was obtained. After a mask having a circular pattern of 140 $\mu$m in diameter was brought into close contact with the silver layer as the second layer 4, the inorganic photoresist layer 5 was exposed to a light 6 having a light intensity of 60 mW/cm² on the exposed silver layer surface for 30 seconds. The light was emitted from a 200 W mercury lamp. After the irradiation of light, the sample thus obtained was immersed in aqua regia at room temperature for 150 seconds, and thereafter was washed with water. For complete removal of the unexposed portion of the inorganic photoresist layer, the sample was immersed in a developer consisting of a mixed solution of an aqueous solution of 50 weight % of dimethylamine and water with a volume ratio of 1:1 for 30 seconds, whereby the non-exposed areas were completely dissolved off. Thus a circular pattern having a diameter of 140 $\mu$m was formed as the impurity containing inorganic photoresist layer 7. Then, the heat resistive overcoating layer 8 having a thickness of 0.2 $\mu$m and made of $SiO_2$ was formed by RF sputtering. The resultant sample was subjected to heat treatment in a nitrogen atmosphere at a temperature of 1050° C. for 90 minutes, thereby forming the diffused region 9 having a diffusion depth of 0.8 $\mu$m. The next step was immersion of the $SiO_2$ layer 8 in a buffered HF solution at room temperature for four minutes so that the layer 8 was etched off. The sample was subjected to surface treatment with a mixed solution consisting of $H_2SO_4$ and $H_2O_2$ having a ratio of 3:1 at room temperature for three minutes. The p-n silicon diode thus constructed provided a current-voltage characteristic curve shown in FIG. 11. This diode had good junction characteristics and was comparable to a conventional diode prepared by conventional diffusion process, in terms of breakdown voltage and backward leakage current.

EXAMPLE 2

Figure 12:
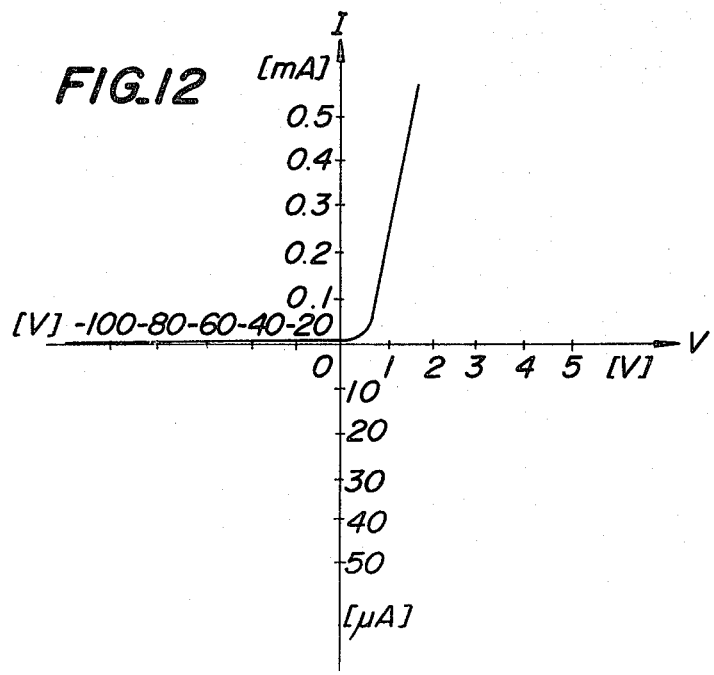

The substrate used was a p-type silicon wafer having a resistivity 0.5 $\Omega$.cm. Formed on the mirror-polished main surface was a first layer 3 having a thickness of 0.2 $\mu$m by a radio-frequency sputtering process with a ternary system material of Se-Ge-As, where arsenic As was an impurity. The chemical composition of the first layer 3 was Se:Ge:As=70:20:10 (atom %). Here, the matrix components Se and Ge of the first layer 3 had a chemical composition of 78 atm % of Se and 22 atom % of Ge. The subassembly thus obtained was processed as in EXAMPLE 1. In the diffusion process, the subassembly was subjected to heat treatment at a temperature of 1000° C. for 50 minutes. The subsequent process was performed as in the case of EXAMPLE 1. The n-p silicon diode thus manufactured exhibited a characteristics curve shown in FIG. 12. This diode had characteristic substantially similar to those of a conventional diode manufactured by usual diffusion method.

EXAMPLE 3

Following the heat treatment in the manufacturing process of $p^+n$ diode in EXAMPLE 1, the entire surface of the $SiO_2$ layer 8 covering the main surface 2 of the silicon substrate 1 and the impurity containing inorganic photoresist layer 7 was coated by a negative type photoresist OSR (product of Tokyo Oka Co. Ltd.). A photo mask having circular pattern of 120 $\mu$m in diameter was used to open a window having a diameter of 120 $\mu$m at a portion of the $SiO_2$ layer 8 over the diffused region 9 having a diameter of 140 $\mu$m by a conventional etching treatment. The portion of the $SiO_2$ layer 8 corresponding to the window was etched off by a buffered HF solution at room temperature for three minutes. The subassembly was subjected to surface treatment with a mixed solution consisting of $H_2SO_4$ and $H_2O_2$ having a ratio of 3:1 at room temperature, washed with water, and then dried. Subsequently, aluminum was deposited with a thickness of 0.7 $\mu$m over the entire surface of the $SiO_2$ layer 8 having windows. The aluminum layer thus deposited was photoetched by a photo mask having a desired electrode wiring pattern in a conventional manner so as to form the conductive layer 11 as a wiring layer of the $p^+n$ diode manufactured in EXAMPLE 1.

According to the present invention, the following advantageous effects are obtained:

(1) The diffusion process is simplified, since the steps to form the diffusion mask layer and its patterning treatment are eliminated and the impurity containing inorganic photoresist region as a diffusion source may be formed in the inorganic photoresist layer itself by the pattern exposure.

(2) The diffusion is performed directly from the patterned impurity containing inorganic photoresist layer as an impurity source layer, so that the process does not involve the problem of dimension change by pattern transformation caused when the diffusion mask layer is formed by a conventional method. Therefore, the dimensional accuracy of the diffused region is improved. In addition, the inorganic photoresist per se has a high resolution. This fact also contributes to the improvement of the accuracy of the diffused region. As a result, a very fine diffused region can be formed according to the invention.

(3) Since the impurity contained inorganic photoresist layer, i.e. the doping source, is covered by the heat resistive overcoating layer, the diffusion atmosphere has no effect on impurity diffusion, so that it is not necessary to control the diffusion atmosphere. This fact also contributes to the simplification of the steps in the fabrication process of semiconductor devices.

(4) The impurity concentration in the inorganic photoresist layer may be controlled with high accuracy. The heat resistive overcoating layer remarkably reduces the vaporization of impurity, compared to a conventional fabrication process. This feature provides an accurate control of impurity doping, and semiconductor devices can be manufactured with high reproducibility on a mass-production basis.

(5) If two impurities, for example, As and P, are included in the first layer, both of the impurities may be diffused simultaneously. As a result, the number of diffusion steps is reduced and the potential for damage to the substrate is reduced.

(6) In the heat treatment, the impurity containing inorganic photoresist layer is encapsulated within the heat resistive overcoating layer. This allows both, p- and n-impurities, to be diffused simultaneoulsy in the same heat treatment. The result is an improvement of yield of semiconductor devices in case of mass-production.

(7) In case of semiconductor III-V compounds, Se may be used directly as n-type impurity without additionally containing a third impurity element in the inorganic photoresist layer.

What is claimed is:

1. A method of fabricating a semiconductor device comprising the steps of:
    forming on the main surface of a semiconductor substrate an inorganic photoresist layer having a first amorphous layer which contains selenium as a matrix component and includes an impurity for providing one conductivity type, and a second layer formed on said first layer, said second layer being a silver or silver-containing layer;
    exposing said inorganic photoresist layer with an exposure pattern;
    developing the exposed inorganic photoresist layer to form an impurity-containing inorganic photoresist layer having a pattern corresponding to said exposure pattern;
    forming a heat resistive overcoating layer on said main surface of said semiconductor substrate, said impurity containing inorganic photoresist layer being covered by said heat resistive overcoating layer; and
    forming a doped semiconductor region by diffusing said impurity from said impurity-containing inorganic photoresist layer into a region of said semiconductor substrate underlying said impurity-containing inorganic photoresist layer.

2. A method of fabricating a semiconductor device as claimed in claim 1, wherein said semiconductor substrate in a silicon substrate, said impurity is selected from the group consisting of arsenic, phosphorus, boron, aluminum indium, gallium, and antimony, and a material of said heat resistive overcoating layer is selected from the group consisting of silicon oxide, silicon nitride, silicon, titanium and platinum.

3. A method of fabricating a semiconductor device as claimed in claim 2, wherein said first layer contains selenium and germanium as matrix components.

4. A method of fabricating a semiconductor device as claimed in claim 3, wherein said matrix components of said first layer have a chemical composition of 75 to 95 atom % of selenium and 5 to 25 atom % of germanium.

5. A method of fabricating a semiconductor device as claimed in claim 3, wherein said matrix components of said first layer have a chemical composition of 75 to 85 atom % of selenium and 15 to 25 atom % of germanium.

6. A method of fabricating a semiconductor device as claimed in claim 2, wherein a material of said second layer is selected from the group consisting of silver, silver alloy, silver chalcogenide and silver halide.

7. A method of fabricating a semiconductor device as claimed in claim 1, wherein, said first layer contains selenium and germanium as matrix components.

8. A method of fabricating a semiconductor device as claimed in claim 7, wherein said matrix components of said first layer have a chemical composition of 75 to 95 atom % of selenium and 5 to 25 atom % of germanium.

9. A method of fabricating a semiconductor device as claimed in claim 7, wherein said matrix components of said first layer have a chemical composition of 75 to 85 atom % of selenium and 15 to 25 atom % of germanium.

10. A method of fabricating a semiconductor device as claimed in claim 1, wherein a material of said second layer is selected from the group consisting of silver, silver alloy, silver chalcogenide and silver halide.

11. The method of claim 1 wherein there is further provided the step of removing at least a portion of said heat resistive overcoating layer.

12. The method of claim 11 wherein there is further provided the step of removing a remaining portion of said impurity-containing inorganic photoresist layer.

13. A method of fabricating a semiconductor device comprising the steps of:
    forming on the main surface of a semiconductor substrate an inorganic photoresist layer having a first amorphous layer which contains selenium as a matrix component and includes impurity for providing one conductivity type and a second layer formed on said first layer, said second layer being a silver or silver-containing layer;
    exposing said inorganic photoresist layer with an exposure pattern;
    developing the exposed inorganic photoresist layer to form an impurity-containing inorganic photoresist layer having a pattern corresponding to said exposure pattern;
    forming a heat resistive overcoating insulating layer on said main surface of said semiconductor substrate, said impurity-containing inorganic photoresist layer being covered by said heat resistive overcoating insulation layer;

forming a doped semiconductor region by diffusing said impurity from said impurity-containing inorganic photoresist layer into a region of said semiconductor substrate underlying said impurity-containing inorganic photoresist layer;

opening in said heat resistive overcoating insulation layer a window for allowing said doped semiconductor region to communicate with the exterior of the semiconductor device; and forming on said heat resistive overcoating insulation layer a conductive layer connected to said doped semiconductor region through said window and extending over said heat resistive overcoating insulation layer.

14. A method of fabricating a semiconductor device as claimed in claim 13, wherein said semiconductor substrate is a silicon substrate, said impurity is selected from the group consisting of arsenic, phosphorus, boron, aluminum, indium, gallium and antimony, and a material of said heat resistive overcoating insulation layer is selected from the group consisting of silicon oxide and silicon nitride.

15. A method of fabricating a semiconductor device as claimed in claim 14, wherein said first layer contains selenium and germanium as matrix components.

16. A method of fabricating a semiconductor device as claimed in claim 15, wherein said matrix components of said first layer have a chemical composition of 75 to 95 atom % of selenium and 5 to 25 atom % of germanium.

17. A method of fabricating a semiconductor device as claimed in claim 15, wherein said matrix components of said first layer have a chemical composition of 75 to 85 atom % of selenium and 15 to 25 atom % of germanium.

18. A method of fabricating a semiconductor device as claimed in claim 14, wherein a material of said second layer is selected from the group consisting of silver, silver alloy, silver chalcogenide and silver halide.

19. A method of fabricating a semiconductor device as claimed in claim 13, wherein said first layer contains selenium and germanium as matrix components.

20. A method of fabricating a semiconductor device as claimed in claim 19, wherein said matrix components of said first layer have a chemical composition of 75 to 95 atom % of selenium and 5 to 25 atom % of germanium.

21. A method of fabricating a semiconductor device as claimed in claim 19, wherein said matrix components of said first layer have a chemical composition of 75 to 85 atom % of selenium and 15 to 25 atom % of germanium.

22. A method of fabricating a semiconductor device as claimed in claim 13, wherein a material of said second layer is selected from the group consisting of silver, silver alloy, silver chalcogenide and silver halide.

* * * * *